United States Patent [19]

Wang et al.

[11] Patent Number: 4,468,669
[45] Date of Patent: Aug. 28, 1984

[54] SELF CONTAINED ANTENNA TEST DEVICE

[75] Inventors: Shii-Shyong Wang; Ruey-Shi Chu, both of Cerritos, Calif.

[73] Assignee: The United States of America as represented by the Secretary of the Army, Washington, D.C.

[21] Appl. No.: 387,098

[22] Filed: Jun. 10, 1982

[51] Int. Cl.³ .................................... G01R 29/08
[52] U.S. Cl. .................................... 343/703
[58] Field of Search ............. 343/703, 760, 894, 17.7, 343/824

[56] References Cited

U.S. PATENT DOCUMENTS

| | | | |
|---|---|---|---|
| 1,966,491 | 7/1934 | Ferrell | 343/703 |
| 2,185,059 | 12/1939 | Kear et al. | 343/703 |
| 2,197,494 | 4/1940 | Erben | 343/703 |
| 2,963,703 | 12/1960 | Sletten | 343/811 |
| 3,143,736 | 8/1964 | Midlock | 343/17.7 |
| 3,378,846 | 4/1968 | Lowenschuss | 343/703 |
| 3,548,310 | 12/1970 | Fenwick | 343/703 |
| 3,697,876 | 10/1972 | Robbins et al. | 343/17.7 |
| 4,107,688 | 8/1978 | Alford | 343/703 |
| 4,409,544 | 10/1983 | Redlich | 343/703 |

Primary Examiner—Eli Lieberman
Assistant Examiner—K. Ohralik
Attorney, Agent, or Firm—Anthony T. Lane; Jeremiah G. Murray; Edward Goldberg

[57] ABSTRACT

Twin lead transmission lines are positioned in close coupling relationship to linearly polarized and planar arrays of antenna radiating elements to provide a self contained instantaneous antenna test and measurement system. Near field energy from the transmission lines is coupled to the transversely arranged antenna dipole elements to permit testing without degrading antenna performance. Signals induced on the radiating elements are of uniform amplitude and linearly changing phase equivalent to those of a far field plane wave. Various tests such as antenna failure and performance characteristic measurements, including gain, pattern and phase difference, can be made automatically. A balanced power divider distributes RF power equally to the twin lead transmission lines and a system processor controls phase shifter scanning elements and analyzes the various output parameters to provide the desired test and measurement information concerning the selected array of dipoles and components.

8 Claims, 6 Drawing Figures

SELF CONTAINED ANTENNA TEST DEVICE

The Government has rights in this invention pursuant to Contract No. DAAB07-76-C-0893 awarded by the Department of the Army.

BACKGROUND OF THE INVENTION

1. Field of the Invention

This invention relates to antenna testing apparatus and particularly to a system using a near field source contained within the antenna for automatically performing tests of selected arrays and dipole elements.

2. Description of the Prior Art

A previously known system for testing phased array radar antennas using a near field source is the "sled" test wherein a movable RF source or horn is manually positioned adjacent the antenna to feed a plane wave to selected elements in a dipole array. The sled is a separate unit which requires repetitive movement for element by element testing and computer analysis of measured data to determine the various characteristics of the array. This system is difficult to use with antennas deployed in remote field locations, requires skilled technical personnel for proper operation, and cannot perform tests instantaneously and automatically.

SUMMARY OF THE INVENTION

It is therefore the primary object of the present invention to provide an antenna test device and system that is self contained within the antenna apparatus and can perform a plurality of tests automatically and instantaneously.

Another object of the invention is to provide a near field signal source for testing phased array antennas which is built into the stationary radome and does not effect the performance of the antenna.

These objects are achieved with a plurality of twin lead transmission lines which are preferably in the form of parallel conductive strips on the surface of the planar dielectric radome adjacent the array of linearly polarized and planar dipole antenna radiating elements. A balanced power divider distributes RF power to the twin lead transmission lines which feed near field energy simultaneously to the transversely arranged dipoles. Signals induced on the radiating elements are of uniform amplitude and linearly changing phase equivalent to those of a far field wave. A system processor from an associated monopulse radar equipment controls phase shifter scanning elements to test and analyze various output parameters and faults. These include antenna microwave path and phase shifter bit-to-bit failure and performance characteristic measurements, including gain, pattern, and phase difference between sum and difference channels. Information is obtained concerning a selected array of dipoles and phase shifters without degradation of antenna performance. The test system is self contained and provides instantaneous automatic measurements. Other objects and advantages will become apparent from the following description in conjunction with the accompanying drawings.

DETAILED DESCRIPTION OF THE PREFERRED EMBODIMENT

Figure 1:
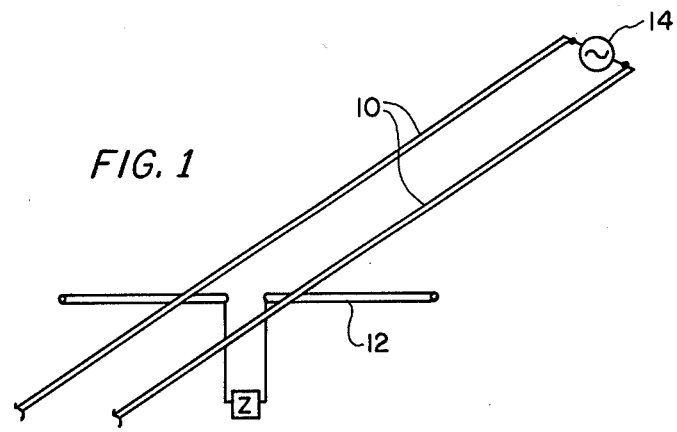
FIG. 1 is a schematic diagram showing the relationship between one parallel lead transmission line and one antenna dipole element.
Figure 2A:
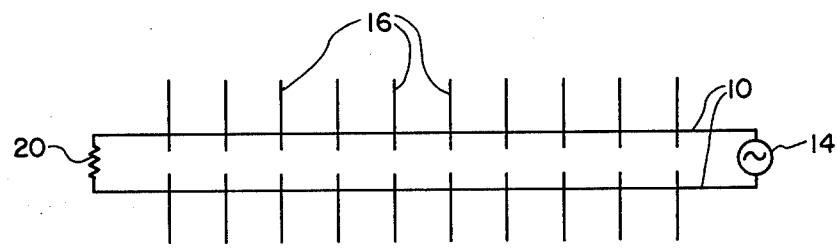
FIGS. 2a and 2b show the relationship between a parallel lead transmission line and tapered twin-lead transmission line feeding a plurality of dipole elements in a linear array.

As shown in FIG. 1, when a twin parallel lead transmission line 10 is positioned in proximity and normal to a linearly polarized antenna dipole radiating element 12, and the line is energized by a time varying source 14, the twin lead generates a time varying field surrounding the conductors which is electromagnetically coupled to the dipole to induce a potential in the dipole. The energy coupling takes place via the near field coupling and not through radiation. A parallel infinitely long twin lead does not radiate electromagnetic energy. The amount of coupling allows a sufficient signal level through the dipole to be detectable while causing very little loading to occur on the twin lead power source. The relatively small loading effect makes it feasible for near field plane wave generation to be employed for testing an antenna with twin lead transmission line feeds. Since the dipole is essentially not a load to the transmission line, the signal amplitude and phase in the line experience practically no change when the signal passes through the dipole load. Therefore a lossless parallel twin lead transmission line 10 can be used to feed a linear dipole array 16, as shown in FIG. 2a. The signal induced on the dipoles will be uniform in amplitude and linearly progressive in phase equivalent to the signal induced by an incident plane wave.

Figure 2B:
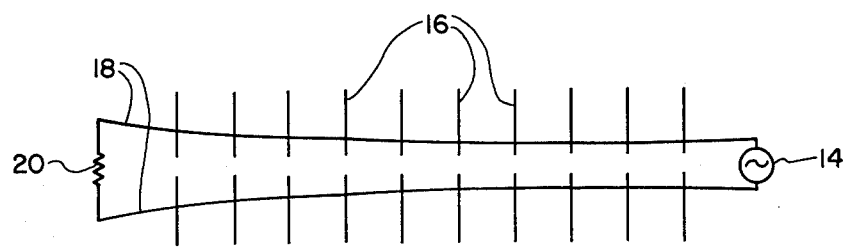

For a lossy transmission line, a slightly tapered twin lead 18 can be used to feed the dipoles, as in FIG. 2b, likewise with uniform amplitude and linearly progressive phase. In this case the amount of coupling changes with the lead spacing. Both lines are terminated in a matched impedance 20. The concept of feeding a linear array can be extended to feed a planar array by parallel operations, as in FIG. 3. The signals induced in the dipoles across the planar array will also be uniform in amplitude and linearly progressive in phase. The transmission lines 10 are preferably in the form of thin conductive strips etched horizontally on the inside surface of the dielectric planar radome 22, or otherwise positioned in close coupling relationship to the antenna dipole array, such as an additional dielectric sheet between the radome and dipoles. The placement of the transmission lines near the antenna aperture does not effect the performance of the array since the transmission lines do not radiate, the sizes of the leads are small due to low power requirements, and no cross polarized fields are generated since the leads and dipoles are positioned perpendicular or normal to one another. Antenna radiation loss due to direct physical blockage by the leads is insignificant.

Figure 3:
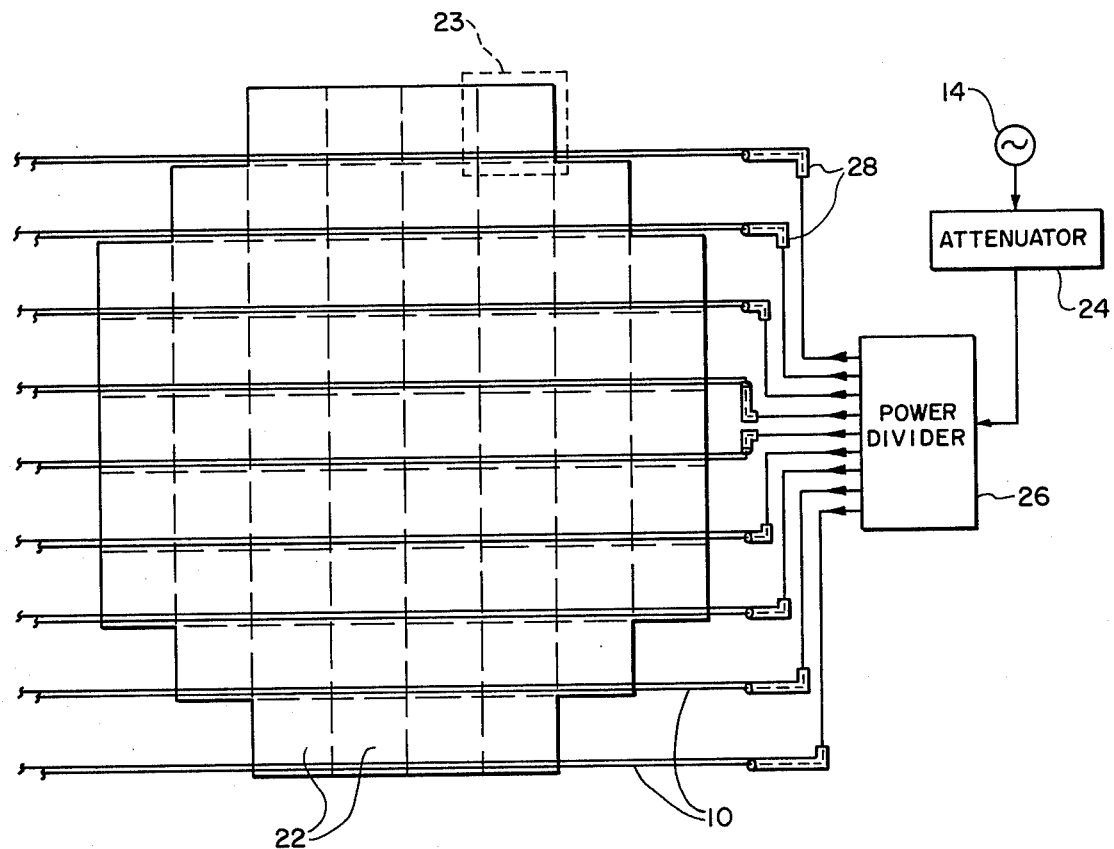
FIG. 3 is a schematic diagram showing a view of a planar antenna radome having a plurality of parallel lead transmission lines disposed thereacross.
Figure 4:
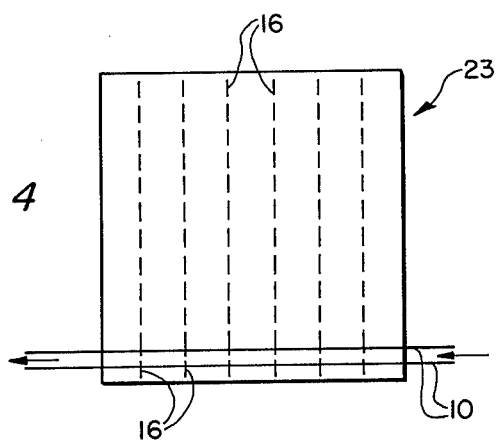
FIG. 4 shows an enlarged subarray portion of the antenna schematically indicating a plurality of dipole elements coupled to a parallel transmission line; and, FIG. 5 shows a system block diagram and associated planar antenna radome incorporating the self-contained testing arrangement of the present invention.

As shown in FIG. 3, nine parallel twin lead transmission lines 10, are used to feed a planar array of dipole radiating elements 16, which are indicated in a subarray module 23 in FIG. 4. The transmission lines and array are fed equally from a source of RF signal 14 through an attenuator 24, a balanced nine-to-one power divider 26, and coaxial cables 28. The signal source may be taken from the radar exciter or transmitter from a point before the transmit-receive device. All modules can be fed simultaneously.

Figure 5:
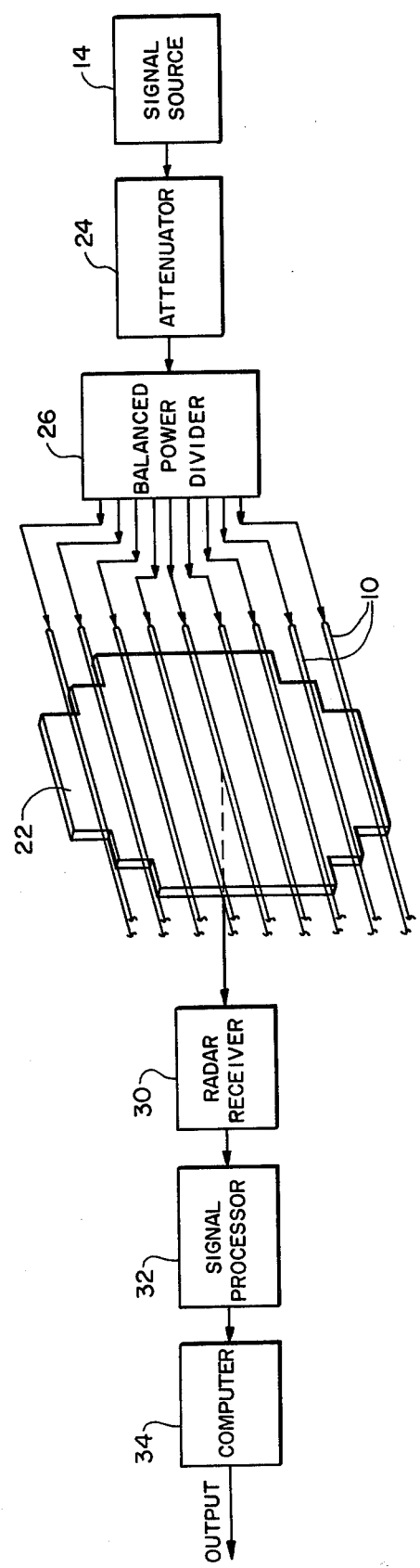

The signal collected by the antenna dipole array will be processed by the radar receiver 30 and signal processor 32, and output data will be extracted by computer 34, as shown in the system diagram of FIG. 5. The signal processor controls the selection of signals passing through particular phase shifters and microwave paths under test. The self contained automatically controlled antenna failure test includes individual phase shifter bit failure tests down to 22.5 degress per bit and a test of the weakest edge element at a predetermined level below the total aperture amplitude when one element per module is fed, microwave feed path failure tests, and the amount of signal degradation in each path. The microwave path includes waveguides, strip lines and coaxial cables.

The failure of a path or the amount of signal degradation in a path can be detected by observing the output from the computer of the strength of the signal which went through the particular phase shifter or microwave path under test. This is determined by a method of phase shifter bit modulation which is accomplished by toggling or switching a phase shifter bit from pulse to pulse in a dwell. The signal passing through a particular phase shifter will be phase modulated at any phase shifter bit value of 22.5°, 45°, 90° and 180° for major phase shifter bits, and 24.8° and 49.6° for subarray bits. Typical examples of known phase shifter bit diode networks for varying the phase of antenna arrays are shown in U.S. Pat. Nos. 3,295,138; 3,778,733 and 3,982,214. The signal so modulated will spread in the doppler domain with peaks appearing at the multiple integer of one half the pulse repetition frequency. The magnitudes are a function of the modulating phase. The power at ½ PRF doppler is outputed at a filter which is capable of completely eliminating any stationary signals. Those signals which are picked up by the rest of the dipoles are not phase modulated and are stationary, so that they would not be picked up by the filter. The phase shifter thus provides a modulated response which is recognized in the doppler filters and system signal processor. The system permits extraction of the signal taking a particular path despite small phase instabilities in the input signal. The amount of signal degradation in the microwave path will be directly reflected in the filter output so that a one dB degradation will reduce the output signal by one dB.

The system is unique in that an individual bit test is feasible, the signal under test is positioned in the middle of the inter-PRF doppler frequency range so that a stationary signal at zero doppler is almost completely eliminated, and both antenna and doppler filter sidelobes can be utilized to provide better detection. Feeding through the antenna sidelobe will reduce total signal to within the system dynamic range and a good signal to noise ratio is obtained for the unit under test.

Use of the twin-lead transmission lines as a built-in plane wave generation source and the high speed data processing facility of the associated radar system permit instantaneous measurements of antenna characteristics. To achieve proper signal feed to the antenna array, it is important not to apply the signal at the end-fire grating lobe angle as this will become a guided wave propagating along the array surface and little signal will be received by the antenna. Instantaneous off-null phase correction constants are also readily measured for the associated radar. The phase correction constants are defined to be the phase difference between the difference (elevation or azimuth) channel and the sum channel. The constants are obtained from the sum and difference channel phases taken from the computer output. The sum channel is associated with a transmission mode, while a difference channel is associated with split beams of a receive mode. Measurement of phase errors of the antenna permits calibration constants to be changed to correct errors. The phase correction constants should be independent of the phase state of the phase shifters, or equivalent to the beam steering angle, since they are common to both the sum and difference channels. The amplitude correction constants can be measured in the same manner.

If all the elements across the array are fed, the pattern on any plane of cut can be measured by steering the unpowered beam to the desired plane of cut. Such a measurement differs from the usual antenna pattern which is taken by mechanically rotating the antenna while keeping phase shifter phase states constant. The pattern obtained is a discrete angle instead of continuous, with output read from the computer. If one dipole per module is fed, only the pattern on the azimuth plane will be significant. There will be one pattern per frequency. It is also noted that the twinlead transmission lines cover the entire antenna aperture and do not change with the beam steering angle. The beam shapes at a particular incident angle can be measured the same way as the pattern measurements. The beam splitting constant can be derived from the beam shapes for the radar tracking/verification applications. The antenna gain can be calculated by the computer from the patterns once all of the dipoles of the antenna are fed.

The present invention thus provides a self contained plane wave generation system which permits making automatically controlled antenna failure tests such as phase shifter and microwave path failure as well as measurements of antenna characteristics including gain, pattern and phase differences. While only a single embodiment has been illustrated and described, it is apparent that other variations may be made in the particular design and configuration without departing from the scope of the invention as set forth in the appended claims.

What is claimed is:

1. A system for testing antennas comprising:
   a planar array of dipole radiating elements;
   a plurality of twin lead transmission lines disposed normal to said planar array in a closely spaced electromagnetic mutual coupling relationship, each transmission line crossing a linear array of said dipoles and being in a common plane with the other transmission lines;
   a near field source of radio frequency signal;
   means for applying said signal equally to said plurality of transmission lines; and
   means for automatically extracting and processing signals from selected portions of said planar array to test and measure characteristics of said array.

2. The system of claim 1 wherein said transmission lines include respective matched terminations.

3. The system of claim 2 wherein said means for applying signal equally includes a balanced power divider.

4. The system of claim 3 wherein said signal applied to said transmission lines feeds respective linear arrays of dipoles with uniform amplitude and progressive phase.

5. The system of claim 4 wherein the spacing between leads of said transmission lines is tapered outwardly toward the matched termination to compensate for power loss along the lines.

6. The system of claim 4 including a dielectric radome, said transmission lines being in the form of horizontal conductive strips along said radome adjacent said planar dipole array.

7. A system for testing antennas comprising:
a linearly polarized array of fixed parallel dipole radiating elements positioned in a common plane;
a twin lead transmission line disposed substantially normal to each said dipole in said array in a closely spaced electromagnetic mutual coupling relationship and having a matched termination at one end;
means providing a near field source of radio frequency signal connected to the other end of said transmission line for generating a plane wave in said line and feeding said array of dipoles with uniform amplitude and progressive phase; and
means for automatically extracting and processing signals from selected portions of said array to test and measure characteristics of said array.

8. The system of claim 7 wherein the spacing between leads of said transmission line is tapered outwardly toward the matched termination to compensate for power loss along the line.

* * * * *